(12) United States Patent
Ha

(10) Patent No.: US 6,240,144 B1
(45) Date of Patent: May 29, 2001

(54) APPARATUS AND METHOD OF LINEARIZING A POWER AMPLIFIER IN A MOBILE RADIO COMMUNICATION SYSTEM

(75) Inventor: Ji Won Ha, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 09/369,628

(22) Filed: Aug. 6, 1999

(30) Foreign Application Priority Data

Aug. 6, 1998 (KR) .................................................. 98/32029

(51) Int. Cl.[7] .............................. H04K 1/02; H04L 25/03; H04L 25/49
(52) U.S. Cl. ............................................. 375/297; 330/149
(58) Field of Search ................................... 375/295, 296, 375/297, 298, 285, 261; 332/103, 123; 330/136, 149; 455/126

(56) References Cited

U.S. PATENT DOCUMENTS

| | | | |
|---|---|---|---|
| 4,291,277 | * 9/1981 | Davis et al. ........................ | 330/149 |
| 4,700,151 | * 10/1987 | Nagata ............................... | 332/123 |
| 5,093,637 | * 3/1992 | Isota et al. ......................... | 332/103 |
| 5,396,190 | * 3/1995 | Murata .............................. | 330/149 |
| 5,404,378 | * 4/1995 | Kimura ............................. | 375/296 |
| 5,699,383 | * 12/1997 | Ichiyoshi .......................... | 375/297 |
| 5,903,611 | * 5/1999 | Schnabl ............................. | 375/297 |
| 5,905,760 | * 5/1999 | Schnabl ............................. | 375/296 |
| 6,075,411 | * 6/2000 | Briffa et al. ....................... | 330/149 |

\* cited by examiner

Primary Examiner—Chi Pham
Assistant Examiner—Jean Corrielus
(74) Attorney, Agent, or Firm—Dilworth & Barrese, LLP

(57) ABSTRACT

An apparatus and method is provided for linearizing the characteristic of a power amplifier in the mobile radio communication system by compensating for the non-linear characteristic of active elements included in a transmitting stage of the system. The apparatus includes an error detector for detecting an error between input and output signals of the power amplifier by comparing the fed-back output signal with the input signal, a predistortion lookup table for storing predistortion data, a predistortion lookup table controller for updating the data of the predistortion lookup table which corresponds to the position of the present input data by adding an error signal from the error detector to an output of the predistortion lookup table, a feedforward lookup table for storing feedforward control data, a feedforward lookup table controller for outputting corresponding feedforward control data of the feedforward lookup table by detecting a size of the error signal, a linearizer for distorting the input signal in accordance with the predistortion data and then controlling a gain of the input signal in accordance with the feedforward control data, and the power amplifier for power-amplifying an output of the linearizer.

13 Claims, 2 Drawing Sheets

APPARATUS AND METHOD OF LINEARIZING A POWER AMPLIFIER IN A MOBILE RADIO COMMUNICATION SYSTEM

BACKGROUND OF THE INVENTION

1. Field of the Invention

The present invention relates generally to a mobile radio communication system, and more particularly to an apparatus and method of linearizing the characteristic of a power amplifier in the mobile radio communication system by compensating for the non-linear characteristic of active elements included in a transmitting stage of the system.

2. Description of the Related Art

A high-power amplifier which is used for transmitting analog data or digital data in mobile radio communication systems requires a high spectrum efficiency as well as a high power efficiency in order to construct a low-power consuming system in a limited frequency band. In order to meet such general requirements in the system, baseband data modulation methods such as QPSK and QAM having a high spectrum efficiency have been used. Also, a high-efficiency power amplifier such as a class C amplifier has been used to improve the power efficiency of a transmitter in the system. Such a high-efficiency power amplifier generally has strong non-linear characteristics, consequently producing a distortion phenomenon, such as a sidelobe reproduction, in its output spectrum. This phenomenon is especially prevalent in the case where a modulated signal such as a QPSK or QAM signal, which does not have a constant envelope characteristic, passes through the power amplifier with the non-linear characteristic.

Various methods have been proposed for preventing the distortion of the output spectrum of the power amplifier resulting from the non-linear characteristics of the power amplifier. One among them is a method of compensating for the non-linear characteristic of the high-power amplifier by adaptively tracking the non-linear characteristic of the power amplifier, predistorting the baseband data in a manner opposite to the distortion caused by the non-linear characteristic of the power amplifier.

FIG. 1 is a block diagram illustrating the construction of a conventional power amplifier employing the above-described adaptive predistortion method.

Referring to FIG. 1, K-bit data encoded by an encoder (not illustrated) is inputted to a shift register 10 and a modulation select read only memory (ROM) 52. The shift register 10 has the length of an L-symbol span, its output has a size of LK bits. At this time, if there is no linear distortion caused by the filtering operation of a filter (not illustrated) existing in the system and the length of one symbol is enough for the length L of the shift register 10, while if a linear distortion due to the system filtering exists, the length of the shift register 10 should be longer than one symbol.

The LK-bit output of the shift register 10 is inputted to a predistort RAM 12. This predistort RAM 12 is stored with predistortion data mapped for data outputted from the shift register 10. The predistortion data is updated in accordance with input error data. Upon receiving data from the shift register 10, the predistort RAM 12 outputs predistortion data corresponding to the received data. That is, the predistort RAM 12 predistorts data outputted from the shift register 10 using error data having a phase opposite to a distortion of the transmission signal so that a radio frequency (RF) transmission section detects the distortion of the transmission signal and compensates for the detected distortion. The output of the predistort RAM 12 is converted to an analog signal for transmission by an I-channel digital-to-analog (D/A) converter 14 and a Q-channel digital-to-analog (D/A) converter 16, respectively. The analog signals converted by the respective D/A converters 14 and 16 are low-pass-filtered through low-pass filters (LPFs) 18 and 20, and then inputted to a quadrature modulator 22. The analog signals inputted to the quadrature modulator 22 are mixed with an output of a first oscillator 32, and then modulated to an intermediate frequency signal in the quadrature modulator 22. The intermediate frequency signal modulated by the quadrature modulator 22 is determined by the first intermediate frequency (IF) oscillator 32, and is mixed with an output of a second oscillator 28 by a mixer 24 to be converted to a final radio frequency (RF) transmission frequency. The RF frequency signal outputted from the mixer 24 is finally amplified by a power amplifier 26, and then transmitted through an antenna.

A portion of the output of the power amplifier 26 is fed back to a mixer 30 by a signal coupler 54, and the fed-back signal is mixed with the output of the second oscillator 28 by the mixer 30 to be converted to a first IF signal. The converted IF signal is then converted to baseband data by a quadrature demodulator 34 using a local oscillation signal outputted from an IF oscillator 32.

The baseband signal converted by the quadrature demodulator 34 is compared with each output signal of D/A converters 48 and 50, which is used as a reference signal for generating an error signal, by analog adders 40 and 42, respectively. Here, output signals of the modulation select ROM 52 are inputted to the D/A converters 48 and 50, and used as reference signals for comparing with the signals fed back to update the value of the predistort RAM 12. The reference signals added in the analog adders 40 and 42 and the fed-back signals are respectively converted to digital signals, and then added to the digital signals of the predistort RAM 12 by digital adders 36 and 46 to update the value of the predistort RAM 12. Error data outputted from the digital adders 36 and 46 are inputted to the predistort RAM 12 via a data bus, and then stored in addresses determined by the shift register 10 to complete the predistortion process with respect to the baseband data.

However, there are some disadvantages according to the conventional predistortion method shown in FIG. 1. First, the shift register 10 for generating addresses and the modulation select ROM 52 for obtaining the reference signal required for generating the error signal must be employed. Also, the high-accuracy adders 40 and 42 for obtaining the error signal must be employed to update the value of the predistort RAM 12. Constructing such high-accuracy analog adders is difficult, and is highly dependant on accuracy. In addition, it is generally known that the performance obtained by the predistortion method is lower than that obtained by a feedforward method.

SUMMARY OF THE INVENTION

Accordingly, the present invention overcomes the disadvantages of the prior art using two objectives. One object of the present invention is to provide an apparatus and method of linearizing the characteristic of a power amplifier in a mobile radio communication system by compensating for the non-linear characteristic of active elements included in a transmitting stage of the system.

Another object of the present invention is to provide an apparatus and method of compensating for the non-linear characteristic of a power amplifier in a mobile radio communication system by a predistortion and feed forward method.

In order to achieve the above objects, in accordance with the present invention, an apparatus for linearizing a power amplifier in a mobile radio communication system is provided, comprising: an error detector for detecting an error between input and output signals of the power amplifier by comparing the fed-back output signal with the input signal; a predistortion lookup table for storing predistortion data; a predistortion lookup table controller for updating the data of the predistortion lookup table which corresponds to a position of a present input data by adding an error signal from the error detector to an output of the predistortion lookup table; a feedforward lookup table for storing feedforward control data; a feedforward lookup table controller for outputting corresponding feedforward control data of the feedforward lookup table by detecting a size of the error signal; a linearizer for distorting the input signal in accordance with the predistortion data and then controlling a gain of the input signal in accordance with the feedforward control data; and the power amplifier for power-amplifying an output of the linearizer.

BRIEF DESCRIPTION OF THE DRAWINGS

The foregoing and other objects, features and advantages of the present invention will become more apparent from the following detailed description when taken in conjunction with the accompanying drawings in which.

DETAILED DESCRIPTION OF THE PREFERRED EMBODIMENTS

Figure 1:
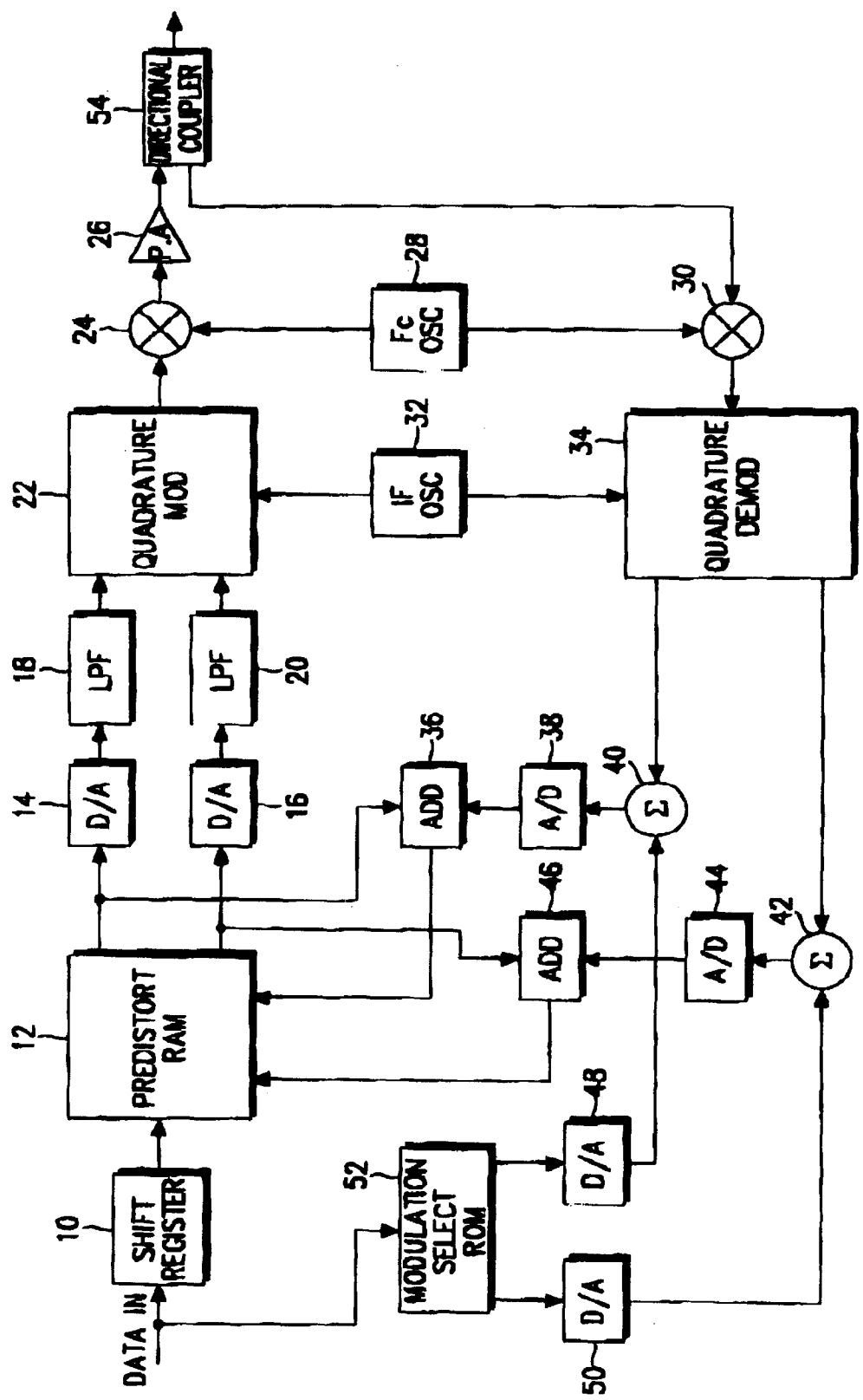
FIG. 1 is a block diagram illustrating the construction of a prior art power amplifier.

The preferred embodiment of the present invention will now be described in greater detail with reference to the drawings, in which the same or similar elements are denoted by the same reference numerals in different drawings. In the following description of the present invention, a detailed description of known functions and configurations will be omitted when it may make the subject matter of the present invention unclear.

The apparatus and method of linearizing the characteristics of a power amplifier in a mobile radio communication system according to a preferred embodiment of the present invention utilize a predistortion algorithm for the baseband signal and a feedforward method for an RF-modulated signal to compensate for the non-linear characteristic of active elements, such as the power amplifier included in a transmitting stage of the system, and thus reduce a distortion phenomenon of an output spectrum of the RF signal.

The address of a lookup table for generating predistortion data is directly generated in accordance with the size of input digital data. The digital data inputted for the generation of reference signals which is to be compared with fed-back signals is synchronized with fed-back received signals by adjusting a delay time using an algorithmic delay of the digital data. The modulated signal is processed by the feedforward method, and thus an additional performance improvement can be obtained as well as the performance improvement obtained by the predistortion algorithm. In other words, the performance of the system can be further improved by applying the feedforward method to the modulated signal, in comparison to the method utilizing only the baseband data predistortion algorithm.

Figure 2:
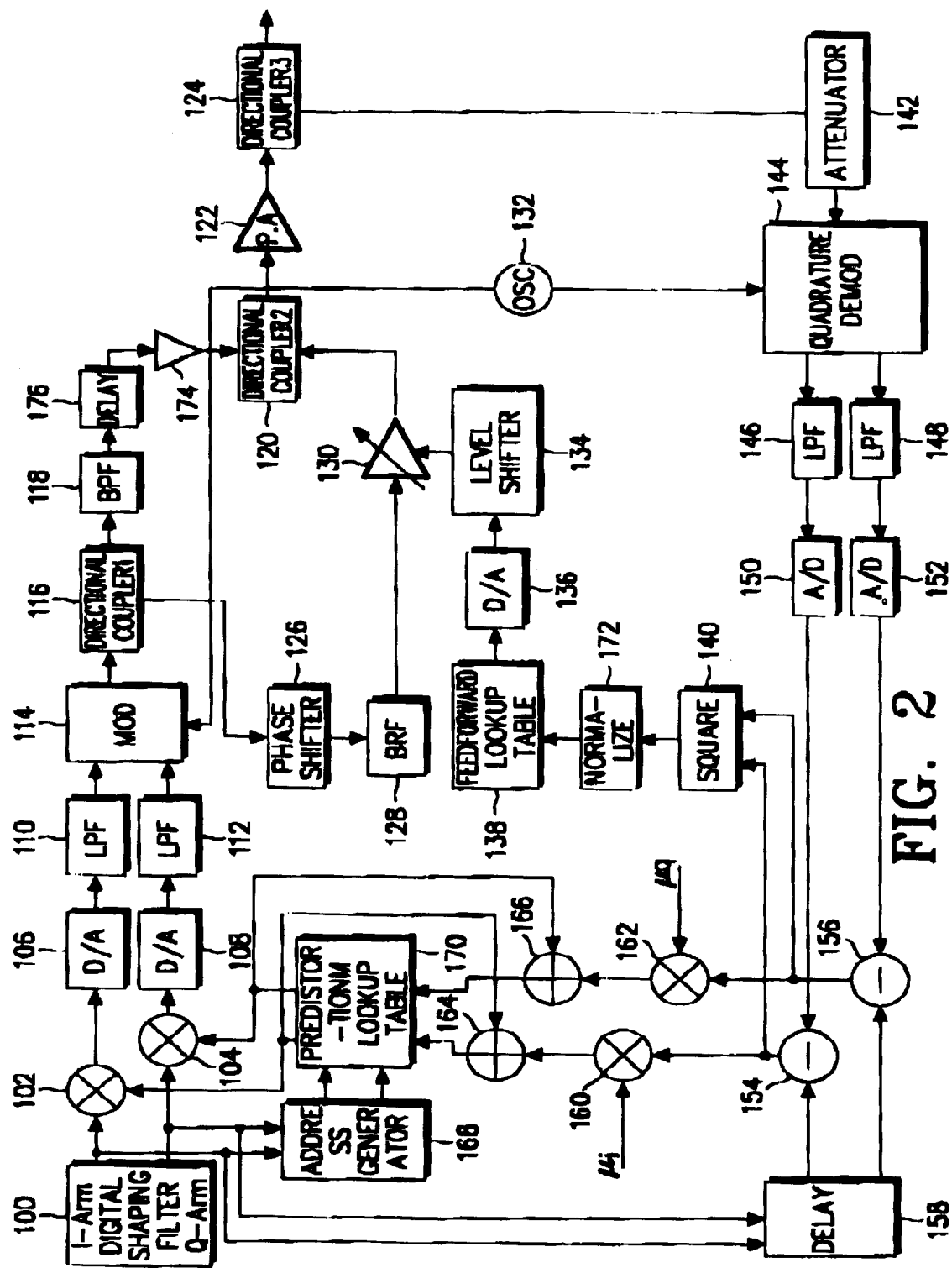
FIG. 2 is a block diagram of the linearizing apparatus of a power amplifier in accordance with a preferred embodiment of the present invention.

FIG. 2 is a block diagram of the linearizing apparatus of a power amplifier according to a preferred embodiment of the present invention.

Referring to FIG. 2, a digital shaping filter 100 receives an input signal and produces I-channel and Q-channel signals of a baseband. Multipliers 102 and 104 receive the I-channel and Q-channel signals outputted from the digital shaping filter 100, respectively, while receiving predistortion data corresponding to the I-channel and Q-channel from a predistortion lookup table 170. The multipliers 102 and 104 output products obtained by multiplying the I-channel and Q-channel signals by the predistortion data, respectively. The D/A converters 106 and 108 convert the digital data outputted from the multipliers 102 and 104, respectively, to analog signals. Low-pass filters 110 and 112 remove unnecessary components from the output signals of the D/A converters 106 and 108, respectively. A quadrature modulator 114 performs a quadrature-modulation with respect to the output signals of the low-pass filters 110 and 112 using a local oscillation frequency outputted from an oscillator 132. The oscillator 132 outputs the local oscillation frequency to the quadrature modulator 114 and the quadrature demodulator 144.

A first directional coupler 116 couples a portion of a modulated signal outputted from the quadrature modulator 114 to apply a coupled signal to a phase shifter 126, and provides a portion of its output to a band-pass filter 118 for passing only the signal of the transmission band. For example, when the power of the modulated signal outputted from the quadrature modulator 114 is 10 dBm, the 9 dBm component of the modulated signal is sent to the band-pass filter while the remaining 1 dBm component is sent to the phase shifter 126. The band-pass filter 118 passes therethrough only the transmission band signal derived from the output signals of the first directional coupler 116. The output of the band-pass filter 118 is phase-matched with a feedforward circuit section by a delay 176, and then inputted to a pre-amplifier 174. The pre-amplifier 174 power-amplifies the output of the delay 176. A second directional coupler 120 couples an output of the pre-amplifier 174 to an output of an automatic gain control amplifier 130 as is explained later. A power amplifier 122 finally power- amplifies an output of the second directional coupler 120.

A third directional coupler 124 feeds back a portion of an output of the power amplifier 122, similarly to the first directional coupler 120. An attenuator 142 attenuates an output of the third directional coupler 124 to a desired level. A quadrature demodulator 144 performs a quadrature-demodulation with respect to an output of the attenuator 142, based on the output of the oscillator 132 received thereto, thereby I-channel and Q-channel signals. Low-pass filters 146 and 148 low-pass-filter the I-channel and Q-channel signals from the quadrature demodulator 144, respectively. A/D converters 150 and 152 convert analog outputs of the low-pass filters 146 and 148, respectively, to digital signals.

A delay 158 delays the I-channel and Q-channel signals from the digital shaping filter 100. Comparators 154 and 156 receive the I-channel and Q-channel signals of the input signal outputted from the delay 158, respectively, while receiving I-channel and Q-channel signals of the fed-back output signal from the A/D converters 150 and 152, respectively. The comparators 154 and 156 compare the received signals, calculating output error signals, respectively. Multipliers 160 and 162 multiply corresponding outputs of the comparators 154 and 156 by adaptation constants μi and μq, respectively. Adders 164 and 166 add outputs of the corresponding multipliers 160 and 162 to I-channel and Q-channel signals of the predistortion lookup table 170, and output added signals to the predistortion lookup table 170. An address generator 168 generates addresses of the predistortion lookup table 170 using the respective I-channel and Q-channel signals outputted from the digital shaping filter 100. The predistortion lookup table 170 is stored with predistortion data for input data therein. The predistortion lookup table 170 also receives an address outputted from the address generator 168 and stores outputs from the adders 164 and 166 in the received address. That is, the predistortion lookup table 170 updates the predistort data corresponding to the address generated from the address generator 168. When the outputs from the adder 164 and 166 have a value of 0, no predistortion data in the predistortion lookup table 170 is updated.

A square block 140 squares and adds the outputs of the comparators 154 and 156. A normalizer block 172 normalizes an output of the square block 140 to adjust the size of the output signal of the square block 140 to an address range of the feedforward lookup table 138, as is explained later. The feedforward lookup table 138 is stored with feedforward compensation data for the output from the normalizer block 172. Upon receiving a signal from the normalizer block 172, the feedforward lookup table 138 outputs feedforward compensation data corresponding to the received signal. A D/A converter 136 converts the compensation data outputted from the feedforward lookup table 138 to an analog signal. A level shifter 134 receives and shifts an output of the D/A converter 136 to a gain-control voltage range of the automatic gain control amplifier 130. A band-rejection filter (BRF) 128 removes a signal of the transmission band from the output signal of the phase shifter 126. The automatic gain control amplifier 130 receives and amplifies an output of the band-rejection filter 128 with a gain determined by a gain control voltage from a level shifter 134, and outputs an amplified signal to the second directional coupler 120.

The operation of the linearization apparatus of the power amplifier in accordance with the above embodiment of the present invention is explained below in detail with reference to FIG. 2. The digital shaping filter 100 performs a pulse-shaping of the respective I-channel and Q-channel digital signals of the baseband. The signals pulse-shaped by the digital shaping filter 100 are inputted to the multipliers 102 and 104 to be respectively multiplied by the corresponding outputs of the predistortion lookup table 170. The output signals of the digital shaping filter 100 are inputted to the address generator 168 to be used for generating the addresses of the predistortion lookup table 170.

The outputs of the digital shaping filter 100 are used for producing the reference signals which are compared with the fed-back signals. At this time, in order to apply the predistortion algorithm to the received data which is the same as the transmitted data, the time point of comparing the transmitted data and the received data must coincide along with a proper delay time for compensating the delay generated at the transmission and the reception stages. The delay 158 delays the output signals of the digital shaping filter 100. If a digital signal processor is employed in the system, such delay operation can be implemented by an algorithm.

In order to update the value of the predistortion lookup table 170, the I-channel and Q-channel signals outputted from the delay 158 are respectively compared with the outputs of the A/D converters 150 and 152 to calculate the error signals. The error signals are then multiplied by the adaptation constants μi and μq for determining the convergence speed and stability of the algorithm in the respective multipliers 160 and 162. Thereafter, the signals are added to the values stored in the predistortion lookup table 170 by the adders 164 and 166, and the added signals are then stored in the address position of the predistortion lookup table 170, as determined by the address generator 168. Since the signals multiplied by the multipliers 102 and 104 are the values prior to the update of the predistortion lookup table 170, the predistortion amount to be applied to following data will be determined by the property of the input data prior to one sample. The output signals of the multipliers 102 and 104 are converted to analog signals by the D/A converters 106 and 108, and the analog signals are inputted to the quadrature modulator 114 through the low-pass filters 110 and 112 for removing the unnecessary high-frequency components.

A portion of the output of the quadrature modulator 114, after passing through the first directional coupler 116, is inputted to the band-pass filter 118, while the other portion thereof is inputted to the phase shifter 126. At this time, the phase shifter 126 serves to shift the phase of the modulated signal by 180 degrees, and this is necessary to produce the predistortion signal used in the feedforward method. The phase-reversed signal outputted from the phase shifter 126 is filtered by the band-pass filter 128, so that the signal of the transmission band is removed, but the signal excepting the transmission band passes through the band-pass filter 128 to be inputted to the automatic gain control amplifier 130. The output of the first directional coupler 116 is filtered by the band-pass filter 118 for passing only the signal of the transmission band, delayed by the delay 176 for compensating for the delay caused by the feedforward circuit, and then amplified by the pre-amplifier 174. The output of the pre-amplifier 174 is added to the output of the automatic gain control amplifier 130 by the second directional coupler 120, and the added signal is finally inputted to the power amplifier 122.

A portion of the output of the power amplifier 122 is coupled by the third directional coupler 124, attenuated by the attenuator 142, and then demodulated by the quadrature demodulator 144. The demodulated signal is filtered through the respective low-pass filters 146 and 148, respectively, and the filtered signals are converted to digital signals by the A/D converters 150 and 152. The outputs of the A/D converters 150 and 152 are compared with the delayed input signals outputted from the delay 158 by the comparators 154 and 156 to produce the error signals. The error signals are used not only for updating the values of the predistortion lookup table 170, but also as the input signals of the feedforward circuit according to the present invention. Specifically, the outputs of the comparators 154 and 156 are squared and then added by the square block 140, and the output of the square block 140 is inputted to the normalizer block 172, so that the size of the output of the square block 140 is adjusted to be within the address range of the feedforward lookup table 138. The normalized signal is then applied to the address of the feedforward lookup table 138.

The output of the feedforward lookup table 138 is converted to an analog signal by the D/A converter 136 to be inputted to the level shifter 134. This is required to match the output voltage of the D/A converter 136 with the gain control voltage range of the automatic gain control amplifier 130. The gain of the automatic gain control amplifier 130 is adjusted by the control voltage of the automatic gain control amplifier 130, which is the output of the level shifter 134, and this causes the size of the transmission signal to be inversely amplified according to the distortion amount of the fed-back signal. Specifically, if the error between the transmission signal and the fed-back signal is large, the distortion signal also becomes large. In this case, the size of the reverse-phased signal which exists outside the transmission band becomes larger by increasing the gain of the automatic gain control amplifier 130. If the error between the transmission signal and the fed-back signal is small, the distortion signal also becomes small. In this case, the size of the reverse-phased signal which exists outside the transmission band becomes smaller by decreasing the gain of the automatic gain control amplifier 130.

According to the above-described method, the phase-reversed unnecessary signal existing outside the transmission band, which is outputted from the automatic gain control amplifier 130, is coupled to the original transmission signal by the second directional coupler 120, and then finally radiated through the power amplifier 122. The system according to the embodiment of the present invention compensates for the non-linear characteristic of the power amplifier 122 by predistorting the data of the baseband, and then further compensates for the spectrum distortion phenomenon using the feedforward method by utilizing the modulated signal as well. Accordingly, the system performance can be improved in comparison to the system for linearizing the power amplifier only using the data predistortion algorithm.

As described above, according to the linearization apparatus of the power amplifier according to the embodiment of the present invention, the address of the lookup table for generating the predistortion data is directly generated in accordance with the size of the input digital data. The digital data inputted for the generation of the reference signals, which is to be compared with fed-back signals, is synchronized with fed-back received signals by adjusting the delay time utilizing the algorithmic delay of the digital data. Also, the modulated signal is processed by the feedforward method, and thus an additional performance improvement can be obtained as well as the performance improvement obtained by the predistortion algorithm. In other words, the performance of the system can be further improved by applying the feedforward method to the modulated signal in comparison to the method utilizing only the baseband data predistortion algorithm.

While this invention has been described in connection with what is presently considered to be the most practical and preferred embodiment, it is to be understood that the invention is not limited to the disclosed embodiment, but, on the contrary, it is intended to cover various modifications within the spirit and scope of the invention as described in the appended claims.

What is claimed is:

1. An apparatus for linearizing a power amplifier in a mobile radio communication system comprising:
   an error detector for detecting an error between input and output signals of the power amplifier by comparing the input signal with the output signal fed back and outputting a corresponding error signal;
   a predistortion lookup table for storing predistortion data;
   a predistortion lookup table controller for updating the data of the predistortion lookup table which corresponds to a position of a present input data by adding the error signal from the error detector to an output of the predistortion lookup table;
   a feedforward lookup table for storing feedforward control data;
   a feedforward lookup table controller for outputting corresponding feedforward control data of the feedforward lookup table by detecting a size of the error signal;
   a linearizer for distorting the input signal in accordance with the predistortion data and then controlling a gain of the input signal in accordance with the feedforward control data; and
   the power amplifier for power-amplifying an output of the linearizer and outputting a power amplified output.

2. The linearizing apparatus as recited in claim 1, wherein the error detector comprises:
   a delay for delaying the input signal;
   a feedback block for feeding back and attenuating the output of the power amplifier;
   a comparator for detecting the error signal by comparing an output of the feedback block and an output of the delay; and
   a multiplier for producing the error signal by multiplying an output of the comparator by an adaption constant.

3. The linearizing apparatus as recited in claim 1, wherein the predistortion lookup table controller comprises:
   an address generator for generating an address of the predistortion lookup table using the input signal; and
   an adder for adding the error signal to the output of the predistortion lookup table to store updated predistortion lookup data corresponding to the address in the predistortion lookup table corresponding to the address.

4. The linearizing apparatus as recited in claim 1, wherein the feedforward lookup table controller comprises:
   a square block for obtaining a size of the error signal by squaring the error signal; and
   a normalizer block for normalizing the output of the square block and outputting a normalized output to the feedforward lookup table.

5. The linearizing apparatus as claimed in claim 1, wherein the linearizer comprises:
   a multiplier for predistorting the input signal by multiplying the input signal by the predistortion data, and outputting the predistorted signal to the power amplifier;
   a phase shifter for phase-shifting an output of the multiplier;
   a band-rejection filter for removing a signal band from an output of the phase-shifter; and
   an automatic gain control amplifier for controlling a gain of an output of the band-rejection filter in accordance with the feedforward control data, and coupling the gain-controlled output to the input signal of the power amplifier.

6. A method of linearizing a power amplifier in a mobile radio communication system having a predistortion lookup table for storing predistortion data and a feedforward lookup table for storing feedforward control data, comprising the steps of
   linearizing an input signal by distorting the input signal using the stored predistortion data and controlling a gain of the predistorted input signal in accordance with the stored feedforward control data;
   power-amplifying and outputting the linearized input signal;
   producing an error signal by comparing a signal resulting from a feed-back of the output signal with a delayed input signal said delayed input signal generated by delaying the input signal; and updating the predistortion lookup table by adding the error signal to the predistortion data and storing the added data in the predistortion lookup table determined by the input data, and applying the error signal to an address of the feedforward lookup table.

7. The linearizing method as recited in claim 6, wherein the linearizing step comprises the steps of:

producing a predistorted signal by multiplying the input signal by the predistortion data;

phase-shifting the predistorted signal;

removing a signal band from the phase-shifted signal to produce a band rejected signal; and controlling a gain of the band-rejected signal in accordance with the feedforward control data and coupling the gain-controlled signal to the predistorted signal.

8. The linearizing method as in claim 6, wherein the error signal producing step comprises the steps of:

delaying the input signal;

detecting the error signal by comparing the output signal with the delayed signal; and producing the error signal by multiplying the detected error signal by an adaption constant.

9. The linearizing method as recited in claim 6, wherein the predistortion data updating step further comprises the step of storing the predistortion data updated by adding the error signal to the output of the lookup table in the predistortion lookup table corresponding to the address.

10. The linearizing method as recited in claim 6, wherein applying the error signal to an address at the feedforward lookup table comprises the steps of:

obtaining a size of the error signal by squaring the error signal; and normalizing the size of the error signal and outputting the normalized error signal to the feedforward lookup table.

11. An apparatus for linearizing a power amplifier in a mobile radio communication system, comprising:

a predistortion lookup table for storing predistortion data;

a feedforward lookup table for storing feedforward control data;

an address generator for generating an address of the predistortion lookup table using an input signal;

means for distorting the input signal by the predistortion data to generate a predistorted signal;

a quadrature modulator for modulating the predistorted signal to generate a modulate d predistorted signal;

a delay for delaying the modulated predistorted signal to generate a delayed modulated predistorted signal;

a linearizer for removing a signal band by coupling the modulated predistorted signal, gain-controlling a filtered signal in accordance with the feedforward control data, and then coupling a gain-controlled signal to the delayed modulated predistorted signal;

the power amplifier for power-amplifying an output of the linearizer to generate a power amplified signal;

a quadrature demodulator for demodulating the power-amplified signal by coupling;

an error detector for detecting an error between the input and output signals by comparing an output of the demodulator and a delayed input signal and outputting a corresponding error signal, said delayed input signal generated by delaying the input signal;

a predistortion lookup table controller for updating the data of the predistortion lookup table which corresponds to a position of a present input data by adding the error signal from the error detector to an output of the predistortion lookup table; and a feedforward lookup table controller for controlling the feedforward lookup table to output corresponding feedforward control data by detecting a size of the error signal.

12. The linearizing apparatus as recited in claim 11, wherein the error detector comprises:

a delay for delaying the input signal;

a comparator for detecting the error signal by comparing an output of the power amplifier and an output of the delay; and a multiplier for producing the error signal by multiplying an output of the comparator by an adaption constant.

13. The linearizing apparatus as recited in claim 11, wherein the feedforward lookup table controller comprises:

a square block for obtaining a size of the error signal by squaring the error signal; and a normalizer block for normalizing the output of the square block and outputting a normalized output to the feedforward lookup table.

* * * * *